United States Patent
Rockwood et al.

(10) Patent No.: US 6,316,768 B1
(45) Date of Patent: *Nov. 13, 2001

(54) PRINTED CIRCUIT BOARDS AS INSULATED COMPONENTS FOR A TIME OF FLIGHT MASS SPECTROMETER

(75) Inventors: Alan L. Rockwood; Larry J. Davis; Jeffrey L. Jones; Edgar D. Lee, all of Provo, UT (US)

(73) Assignee: LECO Corporation, Orem, UT (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/818,376

(22) Filed: Mar. 14, 1997

(51) Int. Cl.[7] .................................................. H01J 49/40
(52) U.S. Cl. ............................................................ 250/287
(58) Field of Search .................................. 250/287, 286, 250/281

(56) References Cited

U.S. PATENT DOCUMENTS

| | | | |
|---|---|---|---|
| 4,390,784 | * 6/1983 | Browning et al. | 250/287 |
| 5,070,240 | * 12/1991 | Lee et al. | 250/287 |
| 5,162,649 | * 11/1992 | Burke | 250/287 |
| 5,280,175 | * 1/1994 | Karl | 250/287 |
| 5,834,771 | * 11/1998 | Yoon et al. | 250/287 |

* cited by examiner

Primary Examiner—Kiet T. Nguyen
(74) Attorney, Agent, or Firm—Thorpe North & Western, LLP

(57) ABSTRACT

The present invention is embodied in a method and apparatus for utilizing inherently insulative material, such as the glass and epoxy resins used in construction of printed circuit boards, for construction of components in a time of flight mass spectrometer. By using printed circuit board materials, the present invention can take advantage of fabrication techniques for providing circuit traces on surfaces, from one side to another as a via, or embedded within the printed circuit material so as to be covered except where necessary to be exposed to make contact with other electrical devices. Embedded circuit traces also enable capacitive coupling to AC energy while maintaining electrical and physical isolation. Consequently, the present invention enables both invasive and non-invasive access to pressure and vacuum chambers.

1 Claim, 8 Drawing Sheets

PRINTED CIRCUIT BOARDS AS INSULATED COMPONENTS FOR A TIME OF FLIGHT MASS SPECTROMETER

BACKGROUND OF THE INVENTION

1. Field of the Invention

The present invention pertains to improved system and sub-system components for time of flight mass spectrometers which are used for detecting, recording and displaying time of flight mass spectrometry data.

2. State of the Art

For the purposes of this invention, time of flight (TOF) mass spectrometry will be defined as the conversion of an electrically recorded mass spectra into a chemically recognizable form. Useful background information about time of flight mass spectrometers and improvements made therein is taught in U.S. patent application Ser. No. 08/751,509 which is herein incorporated by reference.

A common time of flight mass spectrometer architecture exists which will serve as a basis for the present invention. However, it should be remembered that while the present invention is particularly applicable to the systems of a mass spectrometer, the technology is also applicable to other industries.

FIG. 1 is a block diagram which is provided to show some components of a mass spectrometer as known to those skilled in the art. The components identified as 12 are the electronics associated with mass spectrometer which function either as a transient digitizer or a time to digital converter. The electronics 12 are thus electrically coupled to a time of flight mass spectrometer, also known as a waveform recorder, which is generally indicated at 10. A time of flight mass spectrometer 10 is typically constructed of a chamber having an outer vacuum housing 14 and an inner flight tube 16 shown in cross-section. FIG. 1 shows the inner flight tube 16 along its length. The cross section of the inner flight tube 16 can be circular, square or other appropriate tube shapes as known to those skilled in the art of time of flight mass spectrometry. An input port 18 enables particles (ions) to be injected into the flight tube 16 and accelerated down the length of the flight tube 16 by a combination of a pulser 20 (a.k.a. a pulsed repeller plate) and a series of field defining electrodes 22 which are disposed so as to define a pathway 24 within the vacuum housing 14 for the ions to travel. A particle is accelerated down the flight tube 16 toward a microchannel plate 26 and an anode detector 28 (single or multiple anodes). Particles striking the microchannel plate 26 are then detected as an electrical pulse on the anode detector 28, which in turn causes the anode detector 28 to generate an electrical signal which is processed by the electronics 12 associated with the anode detector 28.

An explanation of the mass spectrometer 10 is incomplete without looking at what subsystems precede and follow the mass spectrometer 10. Specifically, these subsystems include the transportation of particles to the mass spectrometer in a transport subsystem 30, and a data system 32 which receives information from the mass spectrometer 10.

The transportation subsystem of particular interest is an ion transport system 30 for directing ions to the mass spectrometer 10. The ion transport system 30 typically includes a series of RF quadrapoles 52 constructed of individual differential pumping units 50. The differential pumping units 50 are typically required because ions are being transported from a pressurized area to the vacuum housing 14. The pressure surrounding the ions is decreased in stages so that a much larger single pumping unit does not have to be used. Consequently, two differential pumping units 50 are shown to illustrate the concept of gradually decreasing pressure.

To provide additional background information, this application incorporates by reference the information taught in U.S. patent application Ser. No. 08/814,898 filed Mar. 12, 1997, with the title TAPERED OR TILTED ELECTRODES TO ALLOW THE SUPERPOSITION OF INDEPENDENTLY CONTROLLABLE DC FIELD GRADIENTS TO RF FIELDS.

In summary, the above-referenced patent application shows state of the art ion transport systems which include the system shown in FIG. 2A. A system 40 is comprised of four electrodes 42, where one electrode 42 is obscured by another in this view. In FIG. 2A, the path 44 an ion 46 travels is shown as indicated to be generally along with and parallel to a lengthwise quadrapole axis 48 of the electrodes 42. The electrodes 42 are charged with an RF component. The RF component is provided so that ions are confined in the radial direction relative to the lengthwise axis 48 of the quadrapole system 40.

The system 40 shown in FIG. 2A is known as an RF quadrapole 52 because of the four electrodes 42 which generate the RF field for confining ions in the radial direction. However, other multipole electrode configurations are also present in the state of the art, such as six (hexapole) or eight (octapole) electrode systems. All function similarly in that the systems provide confinement in the radial direction. However, for an ion 46 traveling near the axis of the system 40, the effect of higher order RF fields created by a greater number of electrodes is minimal.

FIG. 2B is provided to show that the electrodes 42 (FIG. 2A) are arranged such that they are generally positioned at four corners of a square. This means that the distance from any electrode 42 to the nearest two electrodes is generally equidistant for each of the electrodes.

Generating a DC axial field gradient is useful when it is desirable to accelerate ions axially along the quadrapole axis 48. The DC field gradient is also useful in overcoming drag forces arising from the presence of background gas which may be present along the ion path.

An improvement to the RF quadrapole system 40 described above is the creation of quadrapole pairs which are tilted and/or tapered. This effectively doubles the number of electrodes 42 used in the system 40, as will be explained later.

With the above background in mind, some of the problems with state of the art systems for a time of flight mass spectrometer will now be addressed. This will focus attention on the improvements made to the entire system by the present invention. Beginning with the ion transport system 30, it is often necessary to introduce electrical signals into chambers which are pressurized or have a vacuum therein. Chamber walls are typically constructed of discrete insulating materials interspersed with discrete metallic components which are sometimes used for propagating electrical signals. The opposite is also true that the walls are primarily formed of metal and interspersed with insulating material.

Therefore, it would be an advantage to provide a chamber wall which is comprised of materials which are relatively so much easier to fabricate than the chamber walls of the prior art that the costs of the system are significantly reduced.

In a related system shown in FIG. 3, discrete non-insulating material is typically used in the construction of a vacuum flange comprised of a seal 34 and an O-ring 36 for closing a vacuum chamber 38. Furthermore, if electrical signals are to be introduced into the vacuum chamber 38, metallic, glass or ceramic feedthroughs must be provided as conduits through the seal 34. Without the feedthroughs, any electrical signals applied to the seal would be dispersed and insulated from the vacuum chamber by the O-ring which is typically a rubber-like material. The result is that it is difficult and costly to propagate electrical signals into the vacuum chamber 38.

It would therefore be an improvement over the prior art to provide a vacuum seal which would not disperse electrical signals with which it comes into contact. Furthermore, it would be an advantage to provide a seal which did not require the use of a specialized feedthrough which is costly and might require modification of the seal to install.

Another related problem in the prior art is when a skimmer cone is coupled to chamber walls. A skimmer cone shown generally at 51 in FIG. 1 is utilized for the purpose of preserving a supersonic beam in a differentially pumped vacuum system. Skimmer cones of the prior art are comprised of materials which are discrete from the materials used in the construction of the chamber walls 56. The skimmer cone 56 is also used to propagate electrical signals which are used to, for example, generate electrical fields or used by circuitry within the chamber. However, the propagation of an electrical signal requires creating an electrical pathway which is discrete from the materials used in the chamber wall 56 and the skimmer cone 54. Furthermore, the electrical signals must pass between the skimmer cone 54 and the chamber wall 56.

Therefore, it would be an improvement over the prior art to provide a skimmer cone 54 which is constructed integrally with the chamber wall 56. It would also be an improvement to provide an integrated electrical pathway for propagating an electrical signal from outside the vacuum chamber to the inside of the chamber, and finally to the skimmer cone. It would be a further improvement if this could be accomplished at a substantial cost reduction as compared to the prior art.

While the skimmer cone 56 is described as being improved by fabricating it integrally with the materials of the chamber walls 56, this does not exclude the alternative improvement of providing a discrete skimmer cone 56 which can still be integrated to a separate chamber wall 56 more readily than the prior art, as will be discussed later.

What has been generally implied is that the prior art fails to provide a device or method for easily introducing electrical signals into chambers of various pressures (including a vacuum), without substantial difficulty. The source of the difficulty lies in the situation where the material being used for the chamber walls requires the addition of discrete electrical pathways which must be carefully isolated (or insulated) from other electrical pathways and other components of the transport system 30 (FIG. 1). The materials used for the chamber walls do not lend themselves to being easily modified to carry electrical pathways. Furthermore, it is often the case that many electrical signal pathways must cross to reach various circuitry. Crossing electrical pathways is inherently difficult. In addition, conventional feedthroughs a typically expensive ceramic tubing which must be coupled to a metallic surface. Furthermore, metallic walls will short out signals, and insulating walls will carry no signal at all.

Therefore, it would be an improvement over the prior art to provide chamber walls which can cost effectively serve as conduits for electrical pathways which are easily fabricated so as to be integrated into or on the chamber walls. It would be a further advantage to provide the ability to more easily propagate electrical signals from a source outside the chambers to the inside, or vice versa, regardless of the presence of other electrical signal pathways which must be crossed.

Another problem in the prior art is found in the RF quadrapoles 52 (or other RF multipole systems) which are disposed in the differential pumping units 50. The RF quadrapoles 52 are not highly integrated structures in relation to the differential pumping units 50.

Some additional background which is helpful to understand the construction and use of RF quadrapoles follows. A significant drawback to the RF quadrapoles described above is that in addition to an axial DC electrical field, a quadrapolar DC field is disadvantageously generated. The effect of the quadrapolar DC field is summarized as introduction of mass discrimination. More specifically, mass/charge discrimination occurs in that a narrower range of ions can be transported via electrodes, where the range of ions is determined by the mass thereof. To increase an axial acceleration field, a stronger DC field gradient is required. However, the disadvantage is that increasing the strength of the DC gradient results in a corresponding increase in the undesirable quadrapolar DC field.

While a quadrapolar configuration which only has radio frequency energy applied thereto has a theoretical low ion mass cut-off, there is no high ion mass cut-off. However, the addition of the quadrapolar DC field introduces a high ion mass cut-off. In applications requiring a large passband, this high ion mass cut-off is unavoidable in the prior art. This is because the magnitude and sign of the quadrapolar DC field varies with axial position. Therefore, it is not possible to compensate by superpositioning an additional quadrapolar DC field on the system.

Accordingly, it would be an advantage over the prior art to reduce mass discrimination by eliminating the quadrapolar DC field. It would be a further advantage to be able to manipulate the RF quadrapolar, the DC quadrapolar and the DC axial fields independently of each other using better integrated RF quadrapoles.

It would be another improvement over the prior art to provide RF quadrapoles constructed from materials which can have disposed thereon electrically conductive areas for generating electrical fields. In this way, the shape of the RF quadrapoles is determined by the shape of the electrically conductive areas, and not by the shape of the materials forming the RF quadrapole. It would also be an improvement to provide RF quadrapoles which decrease or eliminate quadrapolar DC fields. It would also be an advantage to generate customized axial voltage gradients by selectively shaping the electrically conductive areas on the insulating materials.

The subject matter above has generally been concerned with the ion transport system 30 (see FIG. 1). Moving to the mass spectrometer 10 itself, more detail about the state of the art for this system 10 is also helpful in understanding how it is improved. It was stated previously that the ions travel down an inner flight tube 16. The inner flight tube 16 is disposed within the outer vacuum housing 14. One problem in the state of the art is that existing flight tubes 16 require field defining electrodes to form the inner flight tube 16. Present day implementations of inner flight tubes 16 are costly and difficult to make because of the particular care which is required in creating a proper conduit for the ions to travel from the pulser 20 to the microchannel plate 26.

It would be an improvement to provide an inner flight tube 16 which is less expensive than the prior art by using materials for the support structure of field defining electrodes which is less expensive and relatively simpler to construct when compared to the prior art.

A related aspect is that exposed insulating materials used for construction of the inner flight tube 16 disadvantageously allow the build-up of electrical charges which create electrical fields which can alter the flight path of ions within the inner flight tube.

It would therefore be another improvement to eliminate exposed surfaces of insulating materials being used to construct field defining electrodes. It would be another improvement if the desired electrical fields propagated by the field defining electrodes could be selectively customized in order to alter the trajectory of ions in a desired manner. It would be another advantage if the electrical charge from ions landing on materials of the inner flight tube 16 could be drained away so as to minimize any disturbance which would otherwise be created from the accumulation of ions.

Another improved component of the mass spectrometer 10 is the microchannel plate 26 which the ions strike after traveling the length of the inner flight tube 16. The microchannel plate 26 is shown in greater detail in FIG. 4. The microchannel plate 26 is a actually an array of electron multipliers (called channels 28) oriented in parallel to each other. The channel matrix 28 is usually fabricated from a lead glass which is treated in such a way so as to optimize the secondary emission characteristics of each channel 28 and to render the channel walls semiconducting so as to allow charge replenishment. Thus, each channel 28 can be considered to be a continuous dynode structure which acts as its own dynode resistor chain. Parallel electrical contact to each channel 28 is provided by the deposition of a metallic coating, usually Nichrome or Iconel, on the front and rear surfaces, which then serve as input and output electrodes.

The mounting structure for the microchannel plate 26 typically consists of clamping the microchannel plate 26 between metal "picture frames" 58 as shown in FIG. 5. This structure makes it difficult to make connections with electrical contacts to receive information therefrom because of all the metal used in construction. Furthermore, the metal "picture frames" 58 disadvantageously created hard connection points which could lead to damage of the microchannel plate 26.

It would therefore be an advantage to provide a mounting structure which provided a softer mounting structure to prevent damage to the microchannel plate 26. It would be another advantage to provide a more versatile mounting structure which could provide a plurality of electrical contacts, as well as serving as a mounting structure for additional circuitry in a simple, yet compact structure. Still another advantage would be to integrate insulating and conductive areas in the same mounting structure.

Finally, it would be a further advantage to accomplish signal coupling using buried capacitors which are implemented using electrical traces disposed within a multi-layer printed circuit board.

OBJECTS AND SUMMARY OF THE INVENTION

It is an object of the present invention to provide a method and apparatus for creating a lower cost mass spectrometer by utilizing printed circuit boards for mass spectrometer system components.

It is an object of the present invention to provide a method and apparatus for creating electrical feedthroughs utilizing printed circuit boards (PCBs) as chamber walls.

It is another object to provide a method and apparatus for creating electrical feedthroughs into a vacuum system.

It is another object to provide a method and apparatus for creating electrical feedthroughs into a pressurized system.

It is another object to provide a method and apparatus for creating electrical feedthroughs which run perpendicular or parallel to a face of a system wall.

It is another object to provide a method and apparatus for creating an electrical feedthrough for non-invasively coupling to AC energy on a side of a system opposite to a location of the electrical feedthrough.

It is another object to provide a method and apparatus for creating DC isolation while coupling to AC energy non-invasively.

It is another object to provide a method and apparatus for creating an electrical feedthrough which is coupled to additional circuitry inside or outside of a vacuum chamber or a pressurized chamber.

It is another object to provide a method and apparatus for creating a high density of electrical feedthroughs on a printed circuit board.

It is another object to provide a method and apparatus for shielding electrical feedthroughs using adjacent traces on the printed circuit boards.

It is another object to provide a method and apparatus for creating controllable impedances by selection of printed circuit board geometry.

It is another object to provide a method and apparatus for using printed circuit boards as seals on vacuum or pressurized chambers.

It is another object to provide a method and apparatus for using printed circuit boards to create a vacuum flange from a metallic trace disposed on the printed circuit board.

It is another object to provide a method and apparatus for incorporating electronic circuitry on the metallic vacuum flange.

It is another object to provide a method and apparatus for creating a metallic vacuum flange on a printed circuit board which can be utilized as an electrical feedthrough from outside a chamber to the inside.

It is another object to provide a method and apparatus for creating RF multipoles utilizing printed circuit boards.

It is another object to provide a method and apparatus for creating RF multipoles utilizing printed circuit boards which can modify axial voltage gradients by selectively disposing electrical traces on the printed circuit board.

It is another object to provide a method and apparatus for selectively modifying DC electrical field gradients.

It is another object to provide an improved mass spectrometer system by improving performance of the ion transport system which precedes a mass spectrometer.

It is another object to provide a method and apparatus for eliminating undesirable quadrapolar DC fields in a transport system.

It is another object to provide a method and apparatus for applying RF and DC electrical fields to electrical traces on the printed circuit boards so as to cancel the quadrapolar DC field.

It is another object to provide a method and apparatus for an ion transport system which cancels quadrapolar DC fields by a symmetry of the printed circuit boards.

It is another object to provide a method and apparatus for eliminating undesirable quadrapolar DC fields by doubling the number of electrodes by creating electrode pairs on the printed circuit boards.

It is another object to provide a method and apparatus for increasing a passband of the DC field gradient to thereby enable ions of higher mass to be transported via the printed circuit board RF multipole.

It is another object to provide a method and apparatus for creating supersonic nozzles from printed circuit boards for use in ion transport systems.

It is another object to provide a method and apparatus for creating a skimmer cone from printed circuit board material.

It is another object to provide a method and apparatus for integrally creating a skimmer cone and a chamber wall from printed circuit board material.

It is another object to provide a method and apparatus for coupling a discrete skimmer cone to a chamber wall utilizing printed circuit board material.

It is another object to provide a method and apparatus for creating electrical feedthroughs on the integral printed circuit board chamber wall and skimmer cone.

It is another object to provide a method and apparatus for fabricating a time of flight tube utilizing printed circuit board material.

It is another object to provide a method and apparatus for fabricating a time of flight tube utilizing printed circuit board material which can also introduce additional circuitry via traces on the printed circuit board.

It is another object to provide a method and apparatus for fabricating a time of flight tube utilizing printed circuit board material which is formed into any desired shape.

It is another object to provide a method and apparatus for fabricating a time of flight tube utilizing printed circuit board material where electrical traces on the printed circuit board can eliminate excess electrical charges built-up by ions which strike the walls of the time of flight tube.

It is another object to provide a method and apparatus for utilizing printed circuit boards in chamber walls to eliminate unwanted electrical fields which affect ion trajectory.

It is another object to provide a method and apparatus for utilizing printed circuit boards in chamber walls to eliminate electrical potential floating of time of flight chamber walls.

It is another object to provide a method and apparatus for supporting microchannel plates which provides more protection for the microchannel plates.

It is another object to provide a method and apparatus for adding additional circuitry to microchannel plates by utilizing printed circuit boards as the mounting structure.

It is another object to provide a method and apparatus for reducing cost of a mass spectrometer and its subsystems.

It is another object to provide a method and apparatus for creating a mass spectrometer which is more versatile.

It is another object to provide a method and apparatus for creating a mass spectrometer which can more selectively generate electrical signals for controlling ion movement and detection.

The present invention is embodied in a method and apparatus for utilizing inherently insulative material, such as the glass and epoxy resins used in fabrication of printed circuit boards, for construction of components in a mass spectrometer. By using printed circuit board materials, the present invention can take advantage of fabrication techniques for providing circuit traces on surfaces, from one side to another (vias), or embedded within the printed circuit material so as to covered except where necessary to be exposed to make contact with other electrical devices.

In a first aspect of the invention, electrical traces are provided through printed circuit board material so as to invasively penetrate a chamber which utilizes the printed circuit board material as at least a portion of an enclosure.

In another aspect of the invention, electrical traces are provided so as not to penetrate through printed circuit board material so as to non-invasively couple to AC energy while remaining isolated and decoupled from DC energy sources.

In another aspect of the invention, a vacuum chamber seal is provided as printed circuit board material which utilizes a metallic trace which is pressed against an O-ring to thereby selectively enable propagation of electrical signals between the exterior of the vacuum chamber and the interior by coupling to the electrical trace.

In another aspect of the invention, printed circuit board material is utilized in the construction of RF multipoles utilized for ion transport.

In another aspect of the invention, a supersonic nozzle is integrally fabricated from printed circuit board material so as to enable access to the supersonic nozzle by way of electrical traces disposed on or in the material.

In another aspect of the invention, a skimmer cone is integrally fabricated from printed circuit board material so as to enable access to the skimmer cone by way of electrical traces disposed on or in the material.

In another aspect of the invention, printed circuit board material is utilized to fabricate a time of flight tube of a mass spectrometer to thereby take advantage of the ability to selectively construct electrical traces which form customizable field defining electrodes.

In another aspect of the invention, the printed circuit board material utilized to construct the time of flight tube enables electrical traces to advantageously drain electrical energy from portions of the time of flight tube which become electrically charged due to the collision of ions with the walls of the time of flight tube.

In another aspect of the invention, the printed circuit board material is utilized for mounting the microchannel plate of the mass spectrometer to thereby provide greater protection for the microchannel plate.

In another aspect of the invention, traces are provided on the printed circuit board material used for mounting the microchannel plate to thereby enable access to the microchannel plate.

In another aspect of the invention, insulating surfaces of a flight tube constructed of printed circuit board are not exposed to ions to thereby prevent build-up of electrical charges.

These and other objects, features, advantages and alternative aspects of the present invention will become apparent to those skilled in the art from a consideration of the following detailed description taken in combination with the accompanying drawings.

DETAILED DESCRIPTION OF THE INVENTION

Reference will now be made to the drawings in which the various elements of a preferred embodiment of the present invention will be given numerical designations and in which the preferred embodiment of the invention will be discussed so as to enable one skilled in the art to make and use the invention.

The preferred embodiment of the present invention is embodied in a time of flight mass spectrometer which utilizes an insulating material as a foundation for the structure of the many improvements taught by the present invention. Although nearly any insulating material might be substituted, the preferred embodiment utilizes a combination of glass and epoxy resins or polyimid more commonly known to those skilled in the art as printed circuit boards. However, these are not the only insulating materials which can be utilized. One particular reason that printed circuit board material is so desirable for use in the present invention is that the manufacturing processes are highly developed for the creation of multi-layer boards which can have electrical traces disposed thereon, therein, and therethrough.

It is helpful to mention at the outset that while it is known that printed circuit boards are generally porous, there are printed circuit boards which are not. Therefore, it is also an element of the present invention that the characteristic of being porous is easily overcome by application of a sealing material which prevents passage of air therethrough, or using a non-porous printed circuit board material from the outset. This characteristic of being non-porous becomes critical to the successful use of the present invention when used as at least a portion of a wall of chambers which have different pressures therein. The chambers can be evacuated so as to generate a vacuum, or can be pressurized.

There are many aspects of a time of flight mass spectrometer which the principles of the present invention can be applied. In general, the present invention is applied to those portions of the time of flight mass spectrometer where it is possible to make a substitution of an insulating material which has disposed thereon, therein or therethrough electrical traces for the propagation of electrical energy. As stated above, the most advantageous insulating material has generally been the material used in printed circuit boards because of the well developed manufacturing techniques for their construction, and the disposition of electrical traces therewith.

Beginning with the ion transport system 30 (see FIG. 1), the preferred embodiment of the present invention improves upon the RF quadrapoles comprised of discrete electrodes, and substitutes an RF quadrapole consisting of printed circuit boards arranged so as to form a tube defining a path for ion transport as shown in FIG. 6. Although FIG. 6 shows an RF quadrapole 60, other higher order RF multipole systems can also be constructed.

Figure 6A:
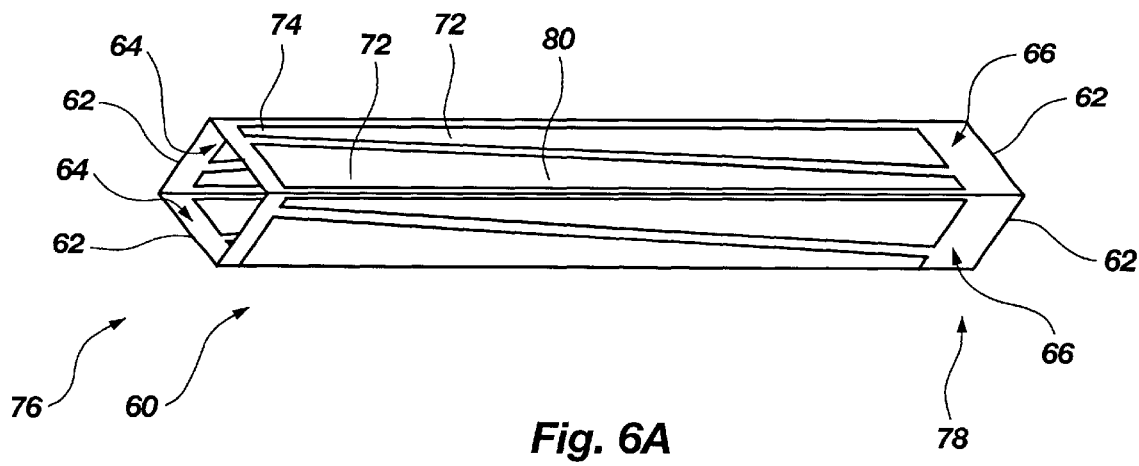
FIG. 6A is a perspective view of an RF quadrapole constructed utilizing four printed circuit boards which have electrical traces disposed thereon for developing RF electrical charges to contain axial movement of ions passing therethrough.
Figure 6B:
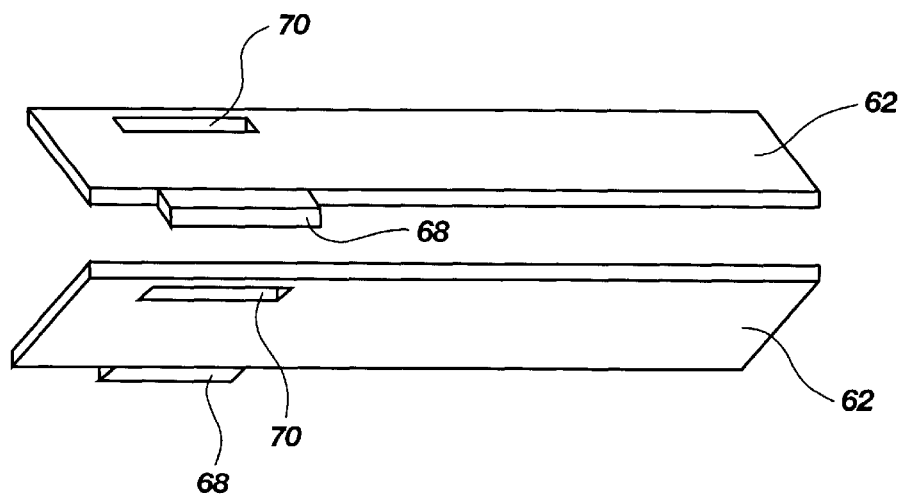
FIG. 6B is a perspective view of a preferred method of joining printed circuit boards together to provide some inherent stability without the use of external coupling mechanisms.

FIG. 6 is a perspective view of the preferred embodiment of the present invention shown in a quadrapolar configuration. The important features of FIG. 6 are recognized upon realization that rods which are typically used as electrodes are now replaced by flat sections of printed circuit board 62 to form the RF quadrapole 60. Electrical traces are disposed on inner surfaces 64, an outer surfaces 66, or both inner and outer surfaces 64 and 66 as shown to provide an electrically conductive material upon which RF voltages are applied to axially confine the ions. As FIG. 6B shows in the preferred embodiment, the printed circuit boards 62 can be joined together by creating interlocking tabs 68 and slits 70 which enable the printed circuit boards 62 to be coupled together. However, it is important to realize that any mechanism for holding the printed circuit boards together in a proper arrangement can be used, and the tabs 68 and slits 70 are just a convenient method of providing some stability to the design.

To avoid the creation of an undesirable quadrapolar DC field, the preferred embodiment can also apply the teaching of the U.S. Patent Application filed Mar. 12, 1997, described earlier. Specifically, each printed circuit board 62 will contain a pair of electrical traces 72 (see FIG. 6A). The pair of complementary traces 72 act to eliminate the undesirable quadrapolar DC field, while enhancing the ability to control DC axial field gradients and RF fields. Specifically, the electrical traces 72 are disposed on the printed circuit boards 62 as shown in FIG. 6A.

FIG. 6A shows that the electrical pair of traces 72 is caused to taper with respect to each other. In other words, while a first electrical trace 74 tapers from a generally narrowest point of the first electrical trace 74 at a distal end 76 of the printed circuit board 62 to a generally widest point at a proximal end 78, a second electrical trace 80 tapers from a generally widest point at the distal end 76 down to a generally narrowest point of the electrical trace 80. The symmetry of the system 60 is what is crucial to the successful implementation of the RF quadrapole 60 using the printed circuit boards 62.

Each electrical trace 74, 80 of the electrode pair 72 has applied thereto a radio frequency (RF) voltage and a direct current (DC) voltage. As explained, the RF voltage is applied to the electrode pair in order to confine ions in the radial direction within the system 60. However, while electrodes 74, 80 within a same electrode pair 72 have the same polarity, adjacent electrode pairs have applied thereto RF voltages which are always opposite in polarity.

In contrast, DC voltages are induced in order to generate an axial DC electrical field in conjunction with the other electrode pairs of the system 60. In order to create an electrical potential between the distal end 76 and the proximal end 78 of the system 60, the distal end and the proximal end must be oppositely charged. The DC voltages induced on the electrode pairs are consistently applied. This means that unlike the RF voltages where a voltage of the same polarity is applied to both electrodes 74, 80 within the electrode pairs, one electrode 74 always has a positive DC voltage applied thereto, and the other electrode 80 of the electrode pair always has a relatively negative DC voltage. Applying the DC voltages consistently means that all electrodes 74 having a same cross section width at the distal end 76 have the same DC voltage in order to generate the axial DC field gradient required to accelerate ions. The choice of whether to apply a positive or negative DC voltage polarity depends upon the application of the ion transfer system, as will be understood by those skilled in the art.

While the present invention lends itself easily to the concept of tapering electrodes, it is possible but much more difficult to implement an RF quadrapole system where the printed circuit boards are tilted. This is because each electrode 74 must tilt with respect to the other electrode 80. The difficulty then arises in forming the tilted electrode pair 72 when printed circuit boards are inherently better for applications requiring a planar surface.

Figure 7A:
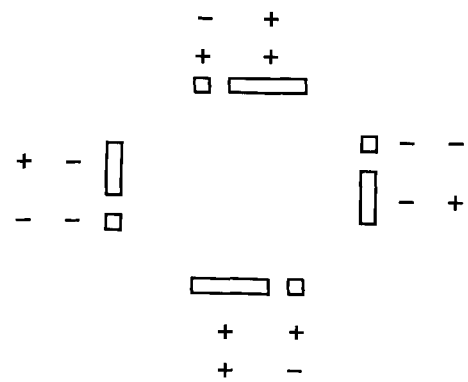
FIG. 7A is a cross-sectional top view of a distal end of the RF quadrapole of FIG. 6A showing applied RF charges nearer the traces and induced DC voltages further away from the traces.
Figure 7B:
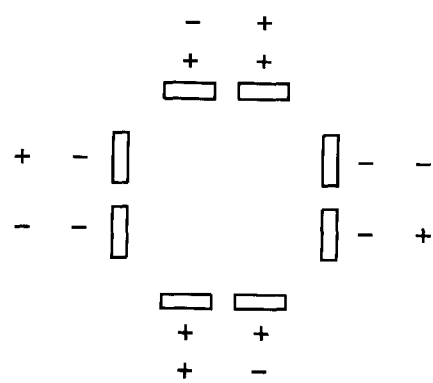
FIG. 7B is a cross-sectional top view of a midpoint of the RF quadrapole of FIG. 6A showing applied RF charges nearer the traces and induced DC voltages further away from the traces.
Figure 7C:
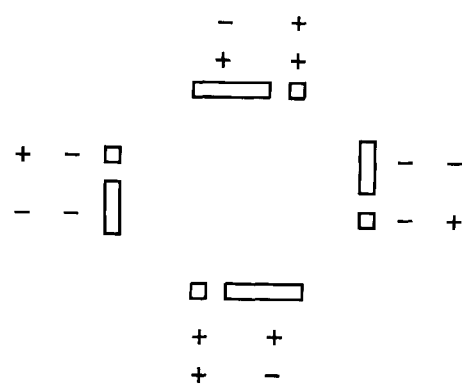
FIG. 7C is a cross-sectional top view of a proximal end of the RF quadrapole of FIG. 6A showing applied RF charges nearer the traces and induced DC voltages further away from the traces.

FIGS. 7A, 7B and 7C provide a more complete illustration of how the RF and DC voltages are applied to the preferred embodiment of the system 60. FIGS. 7A and 7C are end views of the system 60 shown in FIG. 6. FIG. 7A is arbitrarily assigned to illustrate the distal end 76 of the system 60, and FIG. 7C is accordingly assigned to illustrate the proximal end 78 of the system 60. FIG. 7B therefore illustrates approximately a cross section of the electrode pair 72 of the system 60 at a midpoint between the distal end 76 and the proximal end 78.

FIG. 7A not only illustrates the arrangement of the electrodes 72 of the system 60, but also explicitly shows how the RF voltages are applied. As previously explained, a same RF voltage is applied to both electrodes in an electrode pair 72. However, adjacent electrode pairs must always have an RF voltage of opposite polarity applied thereto.

FIG. 7B illustrates the same applied RF voltages as in FIG. 7A, but at the midpoint of the electrodes 72, the width of the electrodes 72 is generally the same.

Finally, FIG. 7C illustrates the same applied RF voltages as in FIGS. 7A and 7B, but the cross sectional width of the electrodes 72 is reversed from that of FIG. 7A.

While the voltage polarity symbols shown nearest to each electrode in FIGS. 7A, 7B and 7C is the RF voltage, the voltage polarity symbol furthest from each electrode is the induced DC voltage. The axial DC field gradient is caused by the DC bias voltages induced in the electrodes of the system 60. As stated previously, the DC voltages are applied differently than the RF voltages. In each electrode pair 72, one electrode has a negative DC polarity, and the other electrode has a positive DC polarity. The result is that an axial DC voltage gradient is generated along the length of the system 60. Identifying the polarity of the DC field gradient is a matter of examining which DC voltage is greater at the distal end 76, the midpoint 82 and the proximal end 78.

Summarizing some of the advantages of the present invention, the number of electrodes in a system is doubled so that all isolated electrodes of the prior art become electrode pairs. The next step is to taper each of the electrode pairs so that when DC voltage is induced, the electrodes create a biased DC voltage gradient. Owing to the very nature of the arrangement of electrodes, the undesirable DC quadrapolar field is advantageously eliminated. However, both the RF quadrapolar field and the axial DC field are present. What is not readily apparent is that ion mass discrimination is substantially minimized. By introducing an axial DC field gradient without creating the quadrapolar field, the ion mass passband is substantially increased, allowing more massive ions to be transported by the system. As a consequence, it is also more likely that systems using longer electrodes can now be used for ion transport.

While the preferred embodiment teaches how to modify a quadrapole configuration, the principles are applicable to higher order electrode configurations as well. Therefore, if an octapole configuration were created, doubling the electrodes would generate a system having 16 electrodes.

The preferred embodiment of the present invention has disclosed applying a positive DC voltage to the first electrode and applying a negative DC voltage to the second electrode of each of the at least four electrode pairs which comprise the quadrapole system 60. However, it should be apparent that in an alternative embodiment, it is advantageously possible to apply positive DC voltages to both of the electrodes in each of the at least four electrode pairs. Conversely, it is also possible to apply negative voltages to both of the electrodes in each of the at least four electrode pairs. In other words, the at least four electrodes pairs can be positively or negatively biased and still function as described. What is important is that the first electrode and the second electrode have different DC voltages applied to them to create the DC axial field gradient.

The versatility of using printed circuit boards for the physical structure of the RF quadrapole provides some unexpected advantages. For example, the structure provided by the printed circuit boards does not have to be square. However, the electrical traces can be disposed thereon and still obtain a desirable electrical field. Furthermore, the shape of the electrical traces can be finely tuned so as to obtain a very precisely controlled quadrapolar field.

Figure 1:
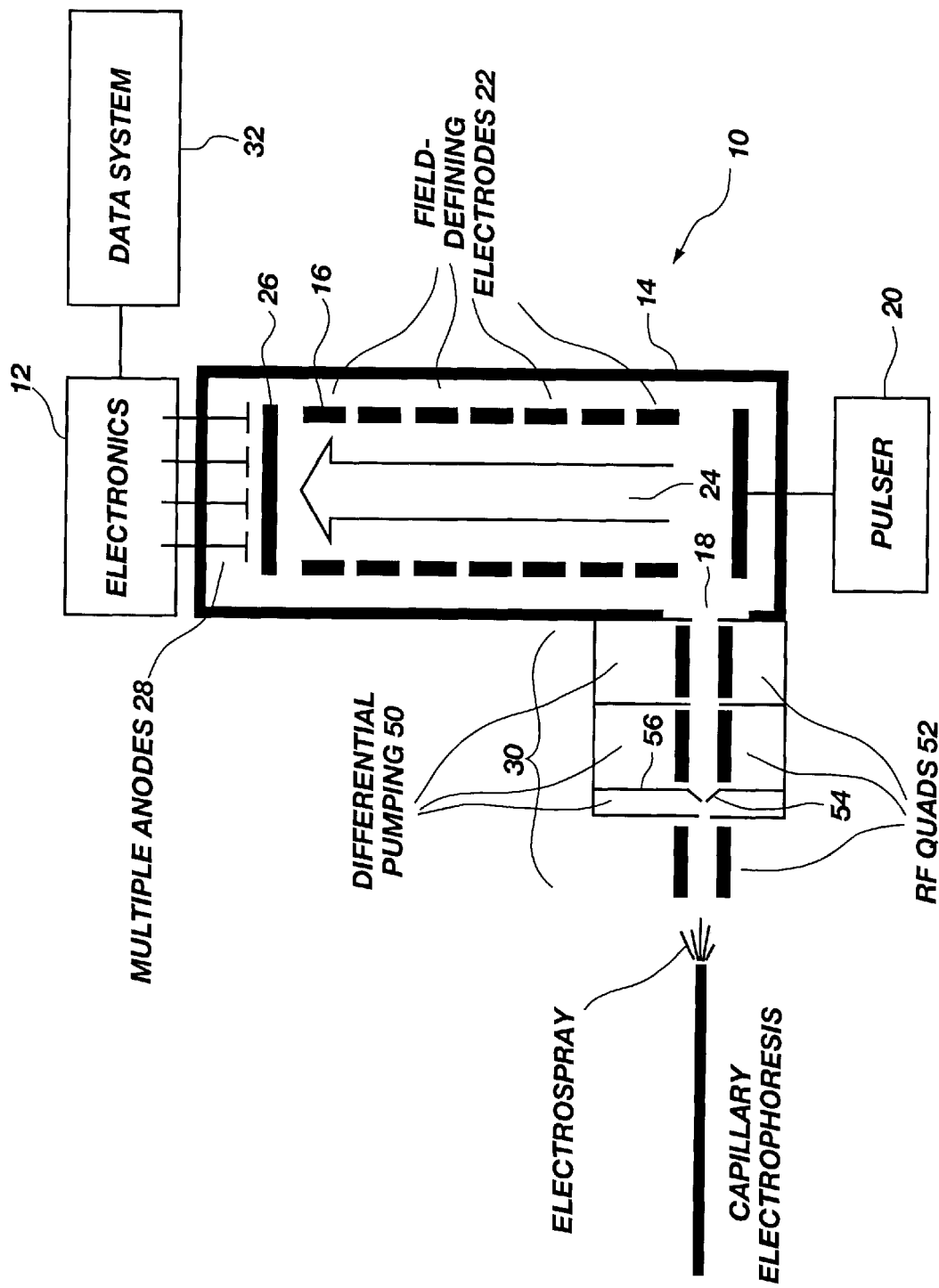
FIG. 1 is a block diagram of a time of flight mass spectrometer as known to those skilled in the prior art. The mass spectrometer includes an ion transport system, a mass spectrometer and a data system for processing information gathered by the mass spectrometer.

The next application of the teachings of the present invention are less precisely confined to a specific area of the time of flight mass spectrometer. This is because the particular invention can be applied to many different areas. However, a specific example of the application is the utilization of a printed circuit board as a wall of a chamber which is either pressurized or evacuated to create a vacuum. In other words, the printed circuit board could be inserted between differential pumping units 50 (FIG. 1). In this way, the printed circuit board forms the wall between chambers.

Figure 8:
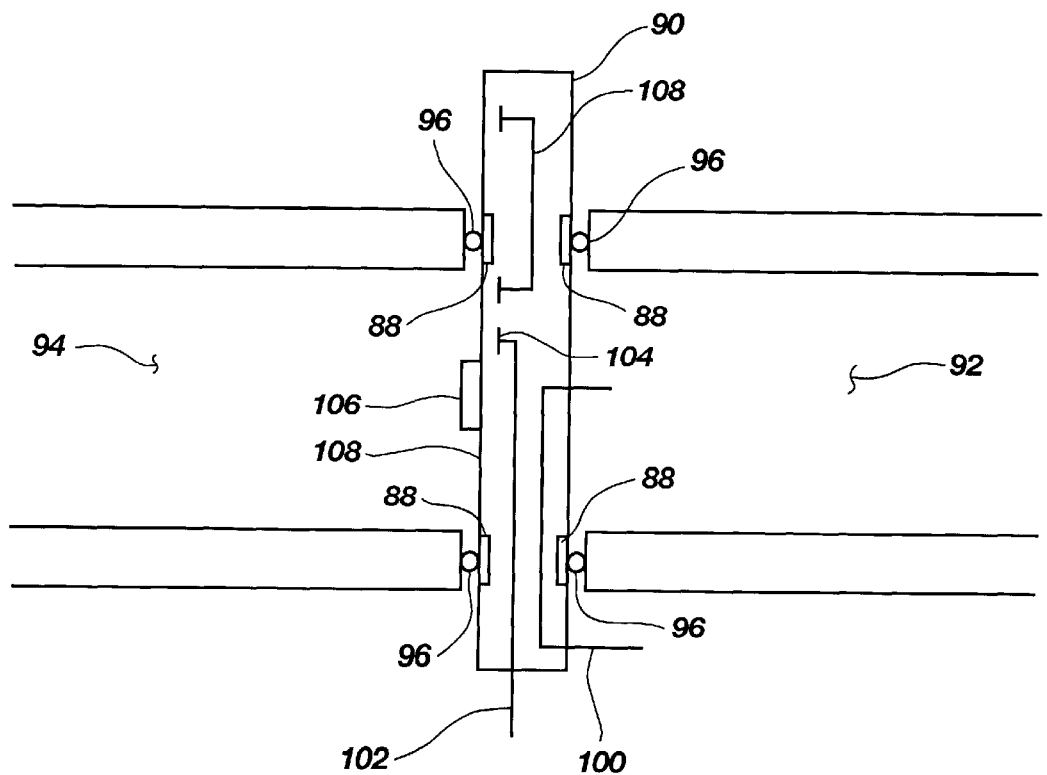
FIG. 8 is a cross-sectional view of a printed circuit board being used as a chamber wall between two chambers, where various types of vias are shown to illustrate how to electrically isolate, physically isolate, and not to isolate the vias.

FIG. 8 illustrates the concept of utilizing a printed circuit board 90 as a wall between chambers 92, 94 of different pressure. It should be noted that there is a flange or O-ring 96 disposed between the housing 98 of the chambers 92, 94 and the printed circuit board 90. In order to protect the printed circuit board 90 from being crushed or from damaging electrical traces, some hardened material 88 (such as an electrical trace which is not connected to a voltage source) is disposed on the printed circuit board 90. The printed circuit board 90 inherently provides the ability to dispose electrical traces thereon and therein as required to thereby propagate an electrical signal from outside a chamber 92, 94 to inside, or conversely from the inside to the outside. For example, electrical trace 100 is shown as passing into the interior of the printed circuit board 90. Therefore, the printed circuit board 90 is a multi-layer board which enables the deposition of electrical traces therein while the printed circuit board 90 is being fabricated. The electrical trace 100 then travels through the printed circuit board 90 until it is desired to bring the electrical trace 100 to a surface of the printed circuit board 90.

There are several points about the structure defined in FIG. 7 which now bear explanation. First, the electrical trace 100 is what can be referred to as an electrical feedthrough. Another useful word is the term of "via". The via 100 passes from outside the printed circuit board 90 to the interior of the printed circuit board and then back outside again. The via 100 is typically coupled to a power source at one end and to electrical circuitry at the other end.

However, an electrical trace does not have to pass completely through a printed circuit board 90 to be able to receive or transmit useful information. For example, a via 102 is now shown as passing into the printed circuit board 90 from outside the chambers 92, 94, but not exiting at a surface of the printed circuit board 90. Instead, the via 102 forms a plate 104. The insulative characteristic of the printed circuit board 90 does not generally interfere with electrical fields, so the via 102 is able to capacitively couple to electrical energy inside either chamber 92, 94.

In other words, suppose that an electrical device 106 is mounted to a surface 108 of the printed circuit board 90. It should first be recognized that this is also an advantage of using the printed circuit board 90 as a wall because of the ease with which electrical devices can be mounted thereon. It should then be recognized that AC energy will capacitively couple to the via 102. Of course, the converse is also true in that AC energy generated by the via 102 on plate 104 can also be coupled to and sensed by the electrical device 106. Capacitive coupling is particularly useful in coupling to pulsed signals. In the preferred embodiment, pulsed signals generated within a vacuum system are now detectable by electronics disposed outside the vacuum system.

For example, the microchannel plate 26 generates pulsed signals from the anode or anodes disposed within the vacuum housing of the mass spectrometer (see FIG. 1). The pulsed signals are capacitively coupled to the electronics disposed outside the vacuum housing by providing an insulating barrier into which a via partially penetrates. In the preferred embodiment, the insulating barrier is a multi-layer printed circuit board. Consequently, the multi-layer printed circuit board provides DC electrical isolation as well as vacuum isolation. However, vacuum isolation is not required to still gain the benefits of electrical isolation. Nevertheless, even if not providing vacuum isolation, the multi-layer printed circuit board could isolate gases from each other which it is desired not to mix.

Another aspect of the embedded via 102 is that the via 102 is electrically isolated from any DC voltages in either chamber 92, 94. Consequently, the embedded via 102 is a non-invasive transmitter or sensor, depending upon the direction of flow of information. Another alternative embodiment for a via is shown by via 109. This via is electrically isolated from DC voltages in either chamber 92, 94, as well as from DC voltages which are outside of the chambers. This completely embedded via 108 can therefore only be capacitively coupled to.

Figure 9:
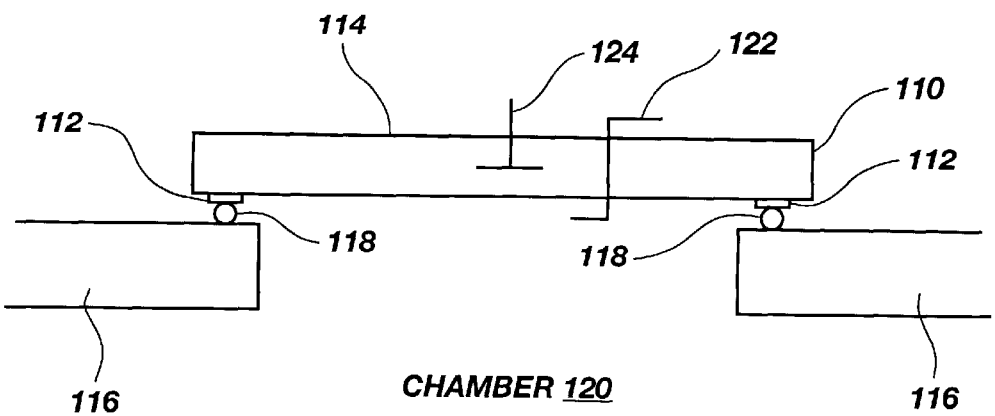
FIG. 9 is a cross-sectional profile view showing an improved vacuum flange as compared to FIG. 3.

FIG. 9 shows that another application of the invention above is that the printed circuit board 110 can also be used as a vacuum flange comprised of a seal 114 (the printed circuit board 110) disposed over an opening in a housing 116, and an O-ring 118 disposed between the seal 114 and the housing 116. Typically, printed circuit boards are not utilized for sealing because of their porous nature. However, once sealed or is a non-porous material is obtained at the outset, printed circuit boards function well because of the ability to have metallic traces 112 disposed thereon. The flange 112 is advantageously fabricated as a metallic trace. The teachings about vias above are then equally as applicable to the vacuum flange 112. In other words, the O-ring 118 can propagate electrical signals from outside of a chamber 120 to the inside, and vice versa. Furthermore, invasive vias 122 and non-invasive vias 124 can also be used to transmit information to or receive information from the inside of the chamber 120. The inside surface 126 of the printed circuit board can also be used for the application of electrical circuitry 128 thereon.

Figure 10:
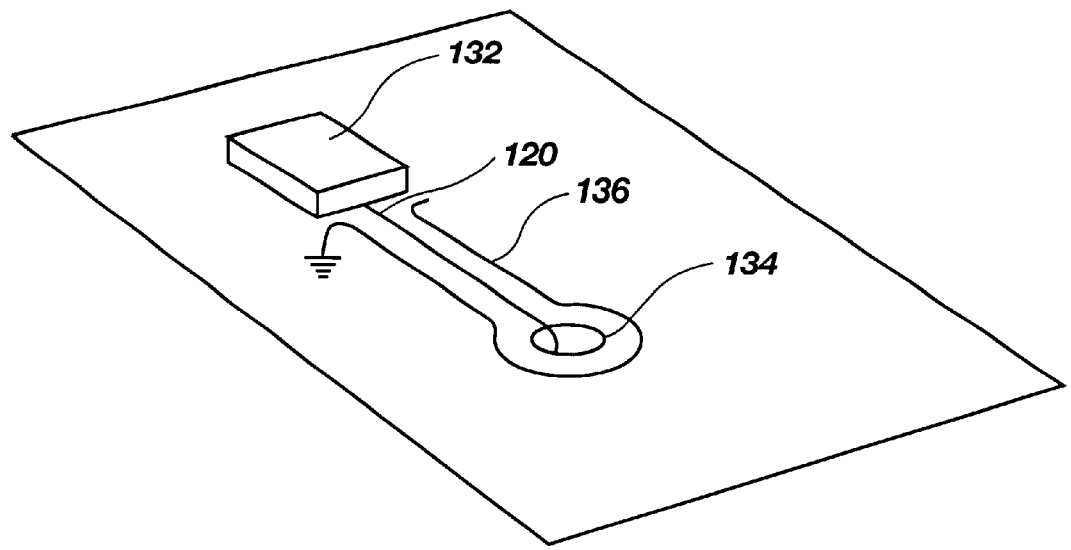
FIG. 10 is a perspective view of an electrical trace which is isolated from electrical fields by way of a lead which surrounds the electrical trace to shield it.

Throughout all the applications of using vias to propagate electrical signals, it should also be remembered that being able to dispose electrical traces on printed circuit boards provides the ability to readily shield particular traces. The shielding can even extend to three dimensions. For example, FIG. 10 shows a via 130 which travels from an electrical circuit 132 to a shielded conduit 134. Between the electrical circuit 132 and the shielded conduit 134, the via 130 is surrounded on both sides by another trace 136 which is preferably grounded in order to prevent electrical fields from affecting the via 130, and also to prevent an electrical field possibly generated by the via 130 from affecting other electrical circuits, vias, or ions being transported nearby.

Figure 11:
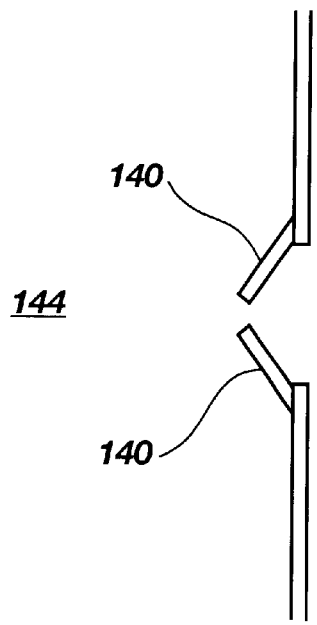
FIG. 11 is a cross-sectional profile view of a skimmer cone which is integrally constructed from printed circuit board material to readily couple to the chamber wall.

FIG. 11 shows in a cross sectional view how the present invention is utilized to apply the teachings of printed circuit boards which propagate electrical signals. More specifically, a skimmer cone 140 is typically a discrete component mounted on a wall of a chamber 144 which has a voltage generated thereon. However, the present invention fabricates the skimmer cone 140 from printed circuit board material. Consequently, electrical traces or vias can be disposed on or through the skimmer cone 140 to generate electrical signals where desired.

This same principle is used to fabricate supersonic nozzles which require voltages be applied thereto, or that discrete electrical components mounted thereon be provided with a power source or with electrical pathways for signals to and/or from.

Most of the detailed disclosure above is devoted to teaching applications of using printed circuit boards for ion transport. The remaining disclosure focuses on the structure which can be created from printed circuit boards which can be utilized more specifically to benefit the flight tube of the mass spectrometer itself.

Referring back to FIG. 1, the field defining electrodes 22 are housed within a vacuum chamber 14 and are provided to direct ions toward the microchannel plate 26. State of the art implementations of structures for holding in position the field defining electrodes 22 include metal structures which have electrical field generating means disposed thereon.

The present invention significantly simplifies the creation of an inner flight tube 16 by providing a structure on which the field defining electrodes are disposed. A closer examination of the structural details illustrates the benefits of the present invention.

Figure 12:
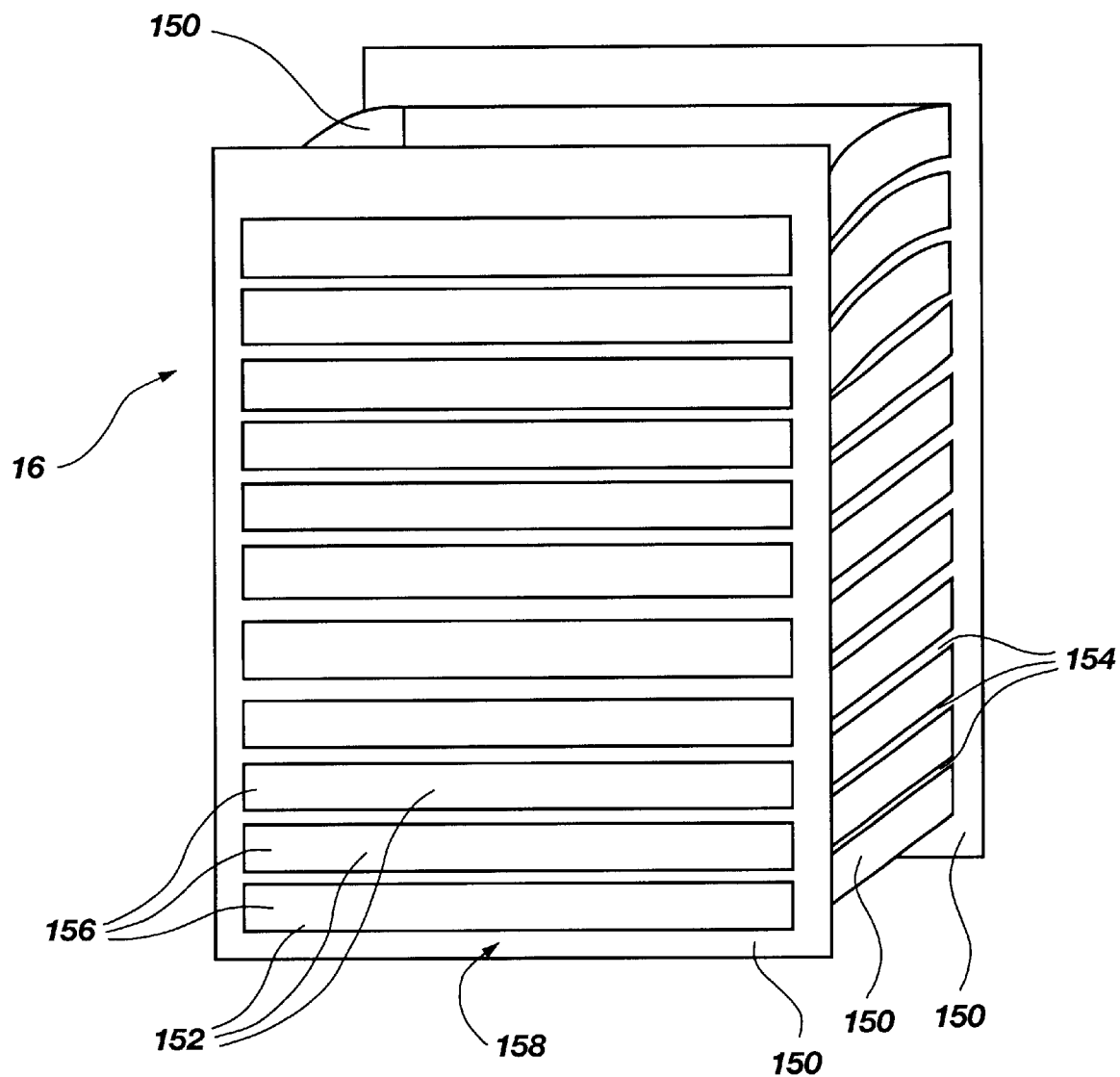
FIG. 12 is a perspective view of a flight tube which utilizes printed circuit boards as the mechanical structure supporting electrical traces which propagate electrical fields for accelerating ions.

FIG. 12 shows a perspective view of a preferred embodiment of an inner flight tube made in accordance with the principles of the present invention. In the preferred embodiment, the inner flight tube generally forms a rectangular conduit which is comprised of four boards constructed of insulating material. The insulating material in the preferred embodiment is printed circuit board material because it is inexpensive and can serve as a structure for electrically conductive traces 152.

The printed circuit boards 150 have a plurality of slots cut therethrough so that the segments 156 of the printed circuit boards 150 can be electrically isolated from each other. In other words, the segments 156 are electrically isolated because the conductive material for the electrical traces 152 is disposed so as not to come in contact with an adjacent segment 156 on a same printed circuit board. In this way, electrical traces 152 or vias can be disposed on and/or in the printed circuit boards 150 to propagate electrical signals such as applied voltages to create the necessary electrical fields.

It should be observed that the electrical traces 152 cover the entire inside surface of each segment 156. However, it is not necessary that the traces 152 extend entirely around the segments 156 to form a continuous loop. To conserve materials, it is only necessary that the trace be extended to at least an outer side 158 of the printed circuit boards 150.

One advantage of the printed circuit boards 150 is that the shape of the segments 156 can be virtually any shape which can be cut from them. The printed circuit boards 150 function only as a mechanical structure on which the field defining electrodes 22 in the preferred embodiment are formed as wide traces 152. However, it should be realized that the mechanical structure can now be used to deposit various electrical circuits thereon. For example, passive components such as voltage dividers or even active components might be added when the need arises. The printed circuit boards 150 even make it possible to bolt or otherwise couple additional electrodes to the printed circuit boards 150, particularly if three dimensional formats are required.

Closer examination of the inner flight tube 16 shows that the printed circuit boards 150 are coupled to each other along mating edges using tabs and slots (not shown, but illustrated in FIG. 6B). Typically, additional structural reinforcement is required when placed within the vacuum housing 14 of the mass spectrometer 10. However, the structure is surprisingly rigid.

A feature which may not appear obvious to an observer of the inner flight tube 16 of FIG. 12 is that the slots 154 between segments 156 on one printed circuit board match up with each slot 154 on the other printed circuit boards 150 so that each slot 154 is generally continuous around the perimeter of the inner flight tube 16. The result is that the segments 156 around the inner flight tube 16 which are on an equal level generate a same electrical field. This provides more concise control over the electrical fields within the inner flight tube 16, and consequently provides greater control over the trajectory of ions which travel therethrough.

It was briefly mentioned that the electrical traces 152 do not need to extend entirely around a printed circuit board segment 156. However, what was not explained is that no portion of the insulating structure, in this case the printed circuit board 150, can be exposed to ions. In other words, the ions must not be able to strike the printed circuit board 150 when traveling through the inner flight tube 16. This is because the insulating material can build up an electrical charge. The resulting electrical charge generates an electrical field which can adversely influence the trajectory of ions traveling through the inner flight tube 16.

A related aspect of the present invention which is related to the inner flight tube 16 is the introduction of a partially conductive coating on the printed circuit boards 150. This coating is used to drain away electrical charges which ions can induce. For example, if an ion lands between traces 152 and onto exposed printed circuit board material 150, the area is coated with a conductive material. The coating would enable the charge from the ion to drain away so that it does not disturb the electrical fields in the inner flight tube 16. The coatings would be disposed so as to provide a discharge path to ground or other voltage level. What is important is that the coating not be left to be electrically floating which would enable an induced electrical field to alter ion flight trajectories.

Figure 2A:
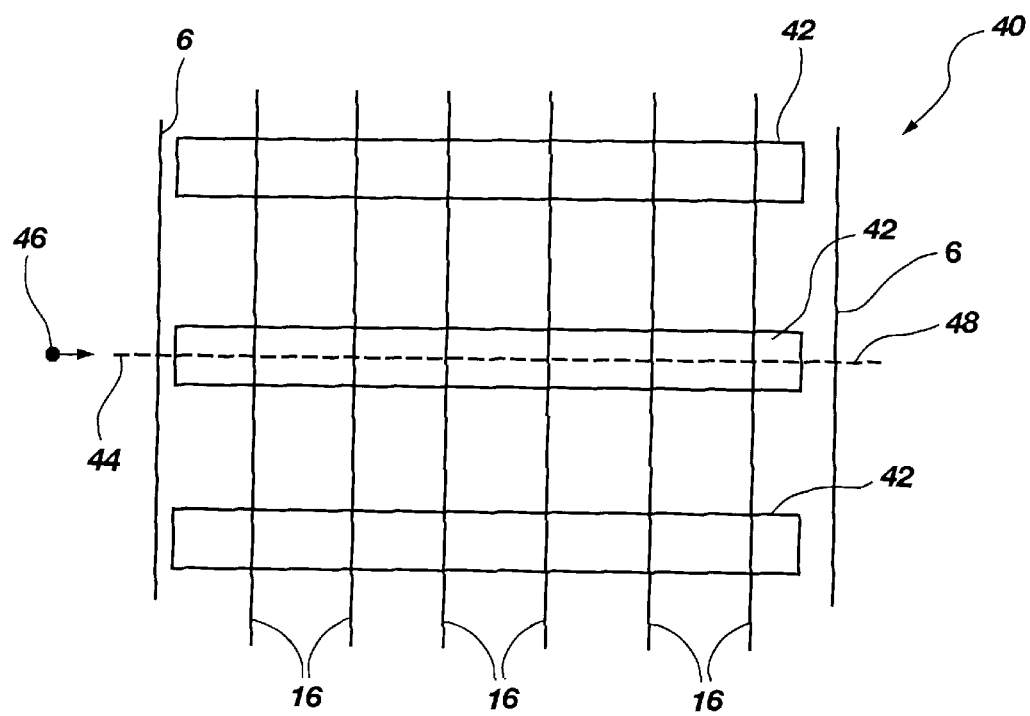
FIG. 2A is a profile view of an RF quadrapole system used for ion transport as known to those skilled in the prior art, including electrodes which are utilized to generate an RF field for confining ions in the radial direction.
Figure 2B:
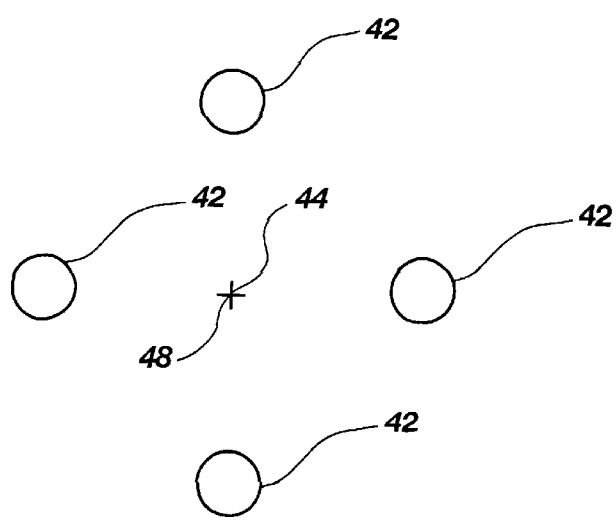
FIG. 2B is an end view of the RF quadrapole system shown in FIG. 2A which provides a better perspective of the electrodes utilized in construction of the RF quadrapole system.
Figure 3:
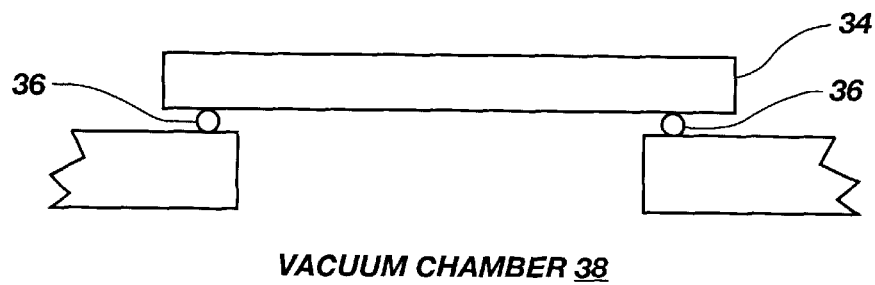
FIG. 3 is a profile view of a prior art vacuum flange which does not readily enable electrical signals to pass between an interior and exterior of the vacuum chamber.
Figure 4:
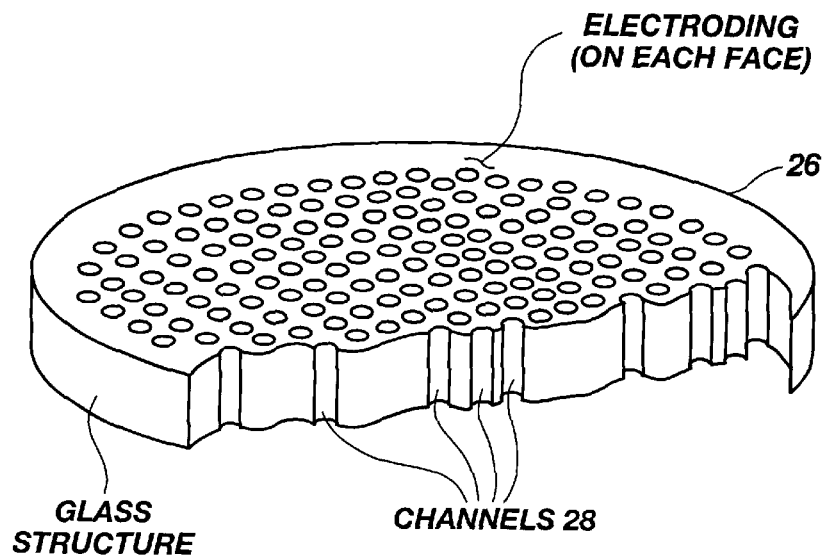
FIG. 4 is a perspective view of a microchannel plate utilized in a mass spectrometer as provided by the prior art.
Figure 5:
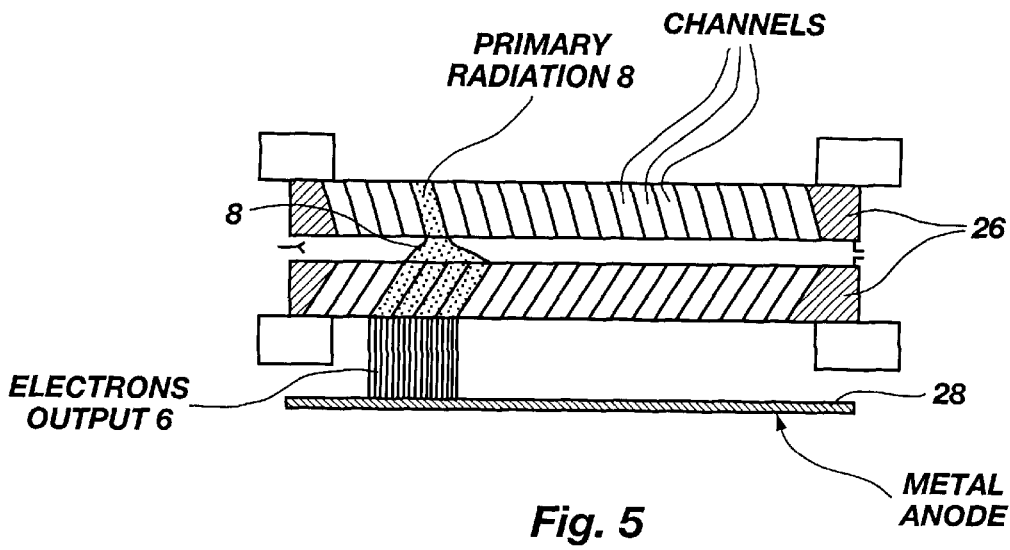
FIG. 5 is a microchannel plate shown suspended by picture frames.

The present invention also teaches application of an insulator on which electrical traces or vias can be disposed for the purpose of providing a mounting structure for the microchannel plate 26 (see FIG. 2). The present invention includes the application of printed circuit boards as "picture frames" to hold the microchannel plate 26. Aside from being a "softer" and less expensive mount than traditional metal mounts, the printed circuit board would provide a versatile coupling conduit for electrical signals to and from the microchannel plate 26.

It is to be understood that the above-described embodiments are only illustrative of the application of the principles of the present invention. Numerous modifications and alternative arrangements may be devised by those skilled in the art without departing from the spirit and scope of the present invention. The appended claims are intended to cover such modifications and arrangements.

What is claimed is:

1. A time of flight mass spectrometer utilized for detecting time of flight mass spectrometry data, wherein the mass spectrometer consists of:

a vacuum housing for receiving ions which are to be accelerated;

an inner flight tube disposed within the vacuum housing through which the ions are directed;

a plurality of field defining electrodes associated with the inner flight tube and activated so as to generate electrical fields which accelerate ions; and a microchannel plate disposed within the vacuum housing to thereby receive the accelerated ions, and wherein the inner flight tube is comprised of a dense non-porous printed circuit board material which does not allow gasses to pass through the printed circuit board, disposed so as to provide a support structure for the plurality of field defining electrodes so that the ions can be accelerated from a receiving aperture of the vacuum housing to the microchannel plate.

* * * * *